United States Patent
Wu et al.

(10) Patent No.: US 9,721,823 B2
(45) Date of Patent: Aug. 1, 2017

(54) METHOD OF TRANSFERRING MICRO-DEVICE

(71) Applicant: AU Optronics Corporation, Hsin-Chu (TW)

(72) Inventors: Tsung-Tien Wu, Hsin-Chu (TW); Ho-Cheng Lee, Hsin-Chu (TW); Kang-Hung Liu, Hsin-Chu (TW); Chih-Che Kuo, Hsin-Chu (CN)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/248,070

(22) Filed: Aug. 26, 2016

(65) Prior Publication Data
US 2017/0133257 A1 May 11, 2017

(30) Foreign Application Priority Data
Nov. 6, 2015 (TW) .............................. 104136599 A (51) Int. Cl.
*H01L 21/683* (2006.01)
*H01L 21/67* (2006.01)
*H01L 33/00* (2010.01)

(52) U.S. Cl.
CPC .... *H01L 21/6831* (2013.01); *H01L 21/67132* (2013.01); *H01L 21/6833* (2013.01); *H01L 33/005* (2013.01)

(58) Field of Classification Search
None
See application file for complete search history.

(56) References Cited

U.S. PATENT DOCUMENTS

| | | | |
|---|---|---|---|
| 7,799,699 B2 | 9/2010 | Nuzzo et al. | |
| 7,943,491 B2 | 5/2011 | Nuzzo et al. | |
| 8,722,458 B2 | 5/2014 | Rogers et al. | |
| 2007/0004178 A1* | 1/2007 | Tsurume | H01L 21/78 438/460 |
| 2014/0169924 A1 | 6/2014 | Golda et al. | |
| 2014/0169927 A1 | 6/2014 | Golda et al. | |
| 2015/0298320 A1* | 10/2015 | Eisele | B25J 15/0071 294/24 |
| 2015/0360940 A1* | 12/2015 | Bathurst | B25J 15/0085 74/470 |

(Continued)

*Primary Examiner* — Asok K Sarkar
(74) *Attorney, Agent, or Firm* — WPAT, PC (57) ABSTRACT

A method of transferring micro-devices is provided. A carrying unit including a carrying substrate, a plurality of electrodes, a dielectric layer covering the electrodes, and a plurality of micro-devices disposed on the electrodes, including a first micro-device and a second micro-device, are also provided. A voltage is applied to an electrode corresponding to the first micro-device, so that an electrostatic force generated on the first micro-device by the carrying unit is larger than a force generated on the second micro-device by the carrying unit. A transfer stamp contacts the first micro-device and the second micro-device, and moves when the transfer stamp contacts the first micro-device and the second micro-device and the electrostatic force is greater than the force generated by the carrying unit, so that the second micro-device is picked up by the transfer stamp and transferred to a receiving unit, and the first micro-device remains on the carrying unit.

8 Claims, 9 Drawing Sheets

(56) References Cited

U.S. PATENT DOCUMENTS

| | | | |
|---|---|---|---|
| 2016/0086837 A1* | 3/2016 | Golda | B81C 99/002 |
| | | | 361/234 |
| 2016/0196998 A1* | 7/2016 | Golda | H01L 21/76898 |
| | | | 361/234 |
| 2016/0318190 A1* | 11/2016 | Prahlad | B25J 15/0085 |
| 2016/0336304 A1* | 11/2016 | Wu | H01L 21/6835 |
| 2016/0379862 A1* | 12/2016 | Smith | H01L 21/6833 |
| | | | 156/273.1 |
| 2017/0062400 A1* | 3/2017 | Li | H01L 24/00 |
| 2017/0062650 A1* | 3/2017 | Chen | H01L 33/005 |

* cited by examiner

METHOD OF TRANSFERRING MICRO-DEVICE

BACKGROUND

Technical Field

The present invention is related to a transferring method, and in particular, to a method of transferring a micro-device.

Related Art

Micro-device transfer technologies have been used in a process for manufacturing newly-developing electronic devices. By using the manufacture of an optical touch sensing panel as an example, in which the process comprises: a plurality of micro-light emitting diodes is transferred from a growth substrate to a touch substrate, and a plurality of photosensitive structures is then manufactured on the touch substrate that carries the micro-light emitting diodes, so that an ultrathin optical touch sensing panel is finished.

Generally, to improve the usage efficiency of a growth substrate, micro-light emitting diodes may be arranged on the growth substrate in a relatively high density. An arrangement density of micro-light emitting diodes on a growth substrate may usually exceed an arrangement density of micro-light emitting diodes on an optical touch sensing panel. Therefore, in the existing prior art, a transfer stamp having a plurality of lug protrusions needs to be provided, and the manner of arranging the plurality of lug protrusions is the same as the manner of arranging the micro-light emitting diodes on the touch substrate. Then, some micro-light emitting diodes on the growth substrate are adhered by the plurality of lug protrusions on the transfer stamp, so that a needed micro-light emitting diode is picked up from an array of light-emitting diodes on the growth substrate, and a micro-light emitting diode that is not needed remains. However, the plurality of lug protrusions on the transfer stamp needs to be aligned with a plurality of micro-light emitting diodes to be picked up when the micro-light emitting diodes to be picked up on the growth substrate are adhered by the plurality of lug protrusions, so that a correct micro-light emitting diode can be picked up from an array of micro-light emitting diodes. This aligning action takes effort and time, and presents a challenge in improving the speed and efficiency of transferring a micro-device.

SUMMARY

The present invention provides a method of transferring a micro-device, wherein the method has a rapid transferring speed.

The method of transferring a micro-device of the present invention includes the following steps: providing a carrying unit, wherein the carrying unit includes a carrying substrate, a plurality of electrodes configured on the carrying substrate, and a dielectric layer covering the electrodes; providing a plurality of micro-devices, wherein the micro-devices are configured on the dielectric layer of the carrying unit, wherein each of the micro-devices is disposed correspondingly to one of the electrodes, and the micro-devices include a first micro-device and a second micro-device; applying a voltage to an electrode corresponding to the first micro-device, so that an electrostatic force $F1$ generated on the first micro-device by the carrying unit is larger than an electrostatic force $F2$ generated on the second micro-device by the carrying unit; providing a transfer stamp having a transfer plane; contacting the transfer plane of the transfer stamp with the first micro-device and the second micro-device, wherein an area of the transfer plane exceeds a distribution range of the micro-devices when the transfer plane is in contact with the first micro-device and the second micro-device; moving the transfer stamp when the transfer stamp is in contact with the first micro-device and the second micro-device and $F1>F2$, so that the second micro-device is picked up by the transfer stamp and the first micro-device remains on the carrying unit; and transferring the second micro-device to a receiving unit by the transfer stamp.

In an embodiment of the present invention, the step of moving the transfer stamp in a condition in which the transfer stamp is in contact with the first micro-device and the second micro-device and $F1>F2$ is: moving the transfer stamp in a direction away from the carrying unit in a condition in which the transfer stamp is in contact with the first micro-device and the second micro-device and $F1>F2$, so that the transfer stamp applies a force $F3$ on the first micro-device and the second micro-device, wherein $F2<F3<F1$, and the direction of the electrostatic force $F1$ and the direction of the electrostatic force $F2$ are opposite to the direction of the force $F3$.

In an embodiment of the present invention, the receiving unit includes a receiving substrate and a receiving layer configured on the receiving substrate, and the step of transferring the second micro-device to a receiving unit by the transfer stamp includes: carrying, by the transfer stamp, the second micro-device to the receiving layer, so as to engage the second micro-device with the receiving layer; and moving the transfer stamp in a direction away from the receiving unit after the second micro-device is engaged with the receiving layer, so that the transfer stamp is separated from the second micro-device.

In an embodiment of the present invention, a joint force between the second micro-device and the receiving layer is $F4$. The transfer stamp applies a force $F5$ on the second micro-device when the transfer stamp is moved in the direction away from the receiving unit. $F4>F5$, and the direction of the joint force $F4$ is opposite to the direction of the force $F5$.

In an embodiment of the present invention, the receiving layer is a photoresist layer, and the step of engaging the second micro-device with the receiving layer includes: contacting the second micro-device with the photoresist layer before the photoresist layer is cured; and curing the photoresist layer in a condition in which the second micro-device is in contact with the photoresist layer.

In an embodiment of the present invention, the receiving layer is a first metal layer, the second micro-device is provided with a second metal layer, and the step of engaging the second micro-device with the receiving layer includes: heating the receiving unit, so that the first metal layer on the receiving unit presents a liquid state; contacting the second metal layer on the second micro-device with the liquid first metal layer; and reducing the temperature of the first metal layer in a condition in which the second metal layer on the second micro-device is in contact with the liquid first metal layer, so that the first metal layer and the second metal layer form an alloy.

In an embodiment of the present invention, the transfer stamp is made of polydimethylsiloxane (PDMS).

In an embodiment of the present invention, the micro-device is a micro-light emitting diode.

According to the above, in the method for transferring a micro-device of the present invention, by using a technical means of applying a voltage to an electrode corresponding to a first micro-device, so that an electrostatic force $F1$ generated on the first micro-device by a carrying unit is larger than an electrostatic force F2 generated on a second micro-device by the carrying unit, a transfer plane of a transfer stamp can be in contact with all micro-devices simultaneously, so that the needed second micro-device is picked up and the first micro-device that is not needed is not picked up by mistake. That is, unlike the existing prior art, a correct micro-device can be picked up without aligning a plurality of lug protrusions of a transfer stamp with a plurality of micro-devices to be picked up. Therefore, the method of transferring a micro-device according to an embodiment of the present invention can reduce at least one aligning step, so that the speed of transferring a micro-device is increased.

To make the foregoing features and advantages of the present invention more obvious and easier to understand, details are described in below with embodiments in combination with accompanying drawings.

DETAILED DESCRIPTION

Figure 1:
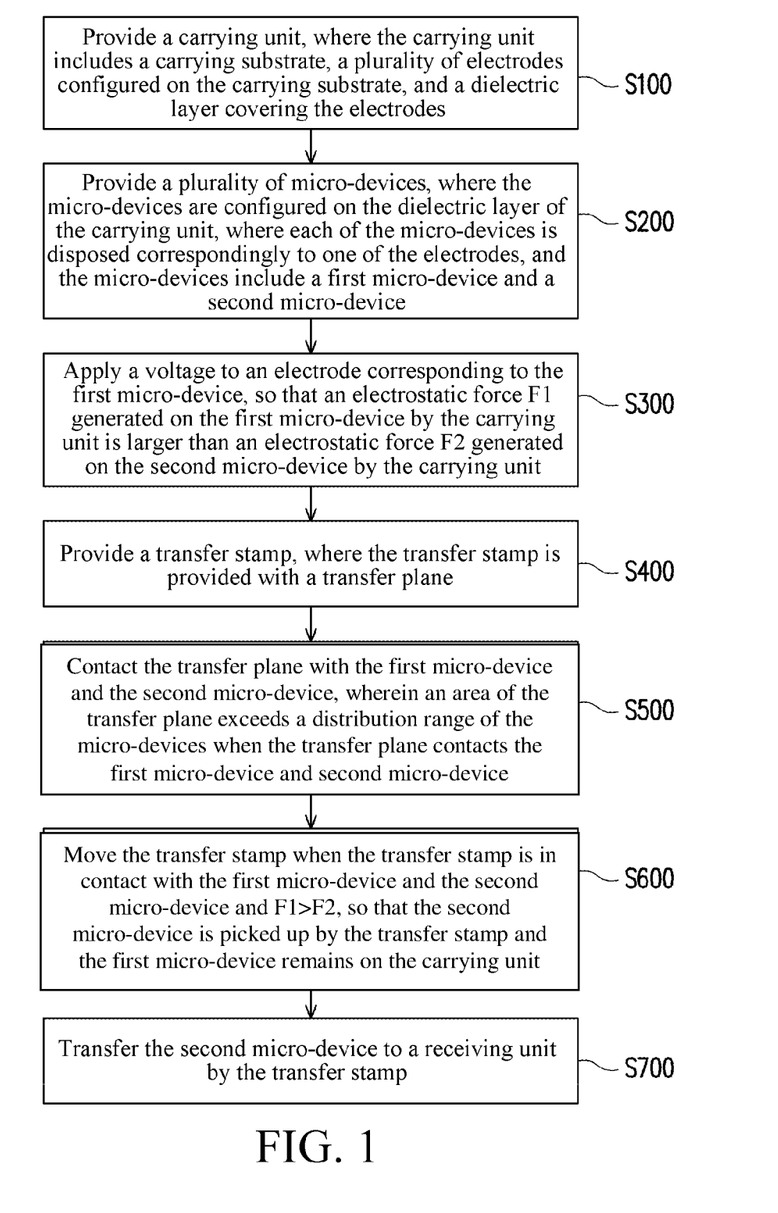
FIG. 1 is a flowchart of a method of transferring a micro-device according to an embodiment of the present invention.

FIG. 1 is a flowchart of a method of transferring a micro-device according to an embodiment of the present invention. Referring to FIG. 1, the method of transferring a micro-device includes the following steps: providing a carrying unit, wherein the carrying unit includes a carrying substrate, a plurality of electrodes configured on the carrying substrate, and a dielectric layer covering the electrodes (step S100); providing a plurality of micro-devices, wherein the micro-devices are configured on the dielectric layer of the carrying unit, wherein each of the micro-devices is disposed correspondingly to one of the electrodes, and the micro-devices include a first micro-device and a second micro-device (step S200); applying a voltage to an electrode corresponding to the first micro-device, so that an electrostatic force F1 generated on the first micro-device by the carrying unit is larger than an electrostatic force F2 generated on the second micro-device by the carrying unit (step S300); providing a transfer stamp, wherein the transfer stamp is provided with a transfer plane (step S400); contacting the transfer plane of the transfer stamp with the first micro-device and the second micro-device, wherein an area of the transfer plane exceeds a distribution range of the micro-devices when the transfer plane is in contact with the first micro-device and the second micro-device (step S500); moving the transfer stamp when the transfer stamp is in contact with the first micro-device and the second micro-device and F1>F2, so that the second micro-device is picked up by the transfer stamp and the first micro-device remains on the carrying unit (step S600); and transferring the second micro-device to a receiving unit by the transfer stamp (step S700).

It should be noted that the sequence of the foregoing step S100 to step S700 is not limited to sequentially performing S100, S200, S300, S400, S500, S600, and S700. Suitable changes may also be made to the sequence of step S100 to step S700. For example, step S100, S200, S400, S300, S500, S600, S700 may be performed sequentially; step S100, S200, S400, S500, S300, S600, and S700 may be performed sequentially; step S400, S100, S200, S300, S500, S600, and S700 may be performed sequentially; or step S400, S100, S200, S500, S300, S600, and S700 may be performed sequentially. The method of transferring a micro-device according to an embodiment of the present invention is specifically described below in combination with FIG. 2A to FIG. 2G.

Figure 2A:
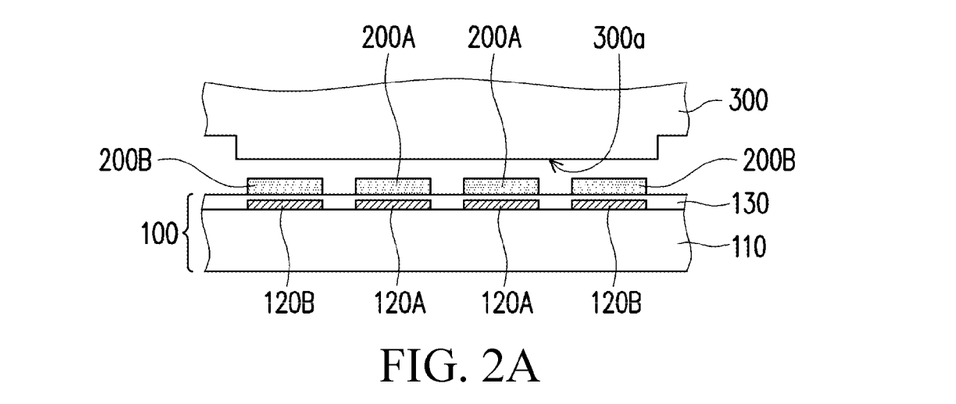
FIG. 2A to FIG. 2G are schematic sectional views of a method of transferring a micro-device according to an embodiment of the present invention.

FIG. 2A to FIG. 2G are schematic sectional views of a method of transferring a micro-device according to an embodiment of the present invention. Referring to FIG. 2A, in this embodiment, first a carrying unit 100 is provided. The carrying unit 100 includes a carrying substrate 110, a plurality of electrodes 120A and 120B configured on the carrying substrate 110, and a dielectric layer 130 covering the plurality of electrodes 120A and 120B.

In this embodiment, the carrying substrate 110 may be, for example, a sapphire base or a silicon base, but the present invention is not limited herein, and in other embodiments, the carrying substrate 110 may also be other types of substrates. The plurality of electrodes 120A and 120B are spaced from each other. The electrodes 120A and 120B may be made of a metal, an alloy, a metal nitride, a metal oxide, a metal nitride oxide, a stacked layer of metal, and another conductive material, or other suitable types of conductors. The dielectric layer 130 may be made of an inorganic material (for example: silicon oxide, silicon nitride, silicon oxynitride, or a stacked layer of at least two of the materials above), an organic material, or a combination of the above.

Referring to FIG. 2A, subsequently, a plurality of micro-devices 200A and 200B is provided, and the plurality of micro-devices 200A and 200B are configured on the dielectric layer 130 of the carrying unit 110. Each micro-device 200A (or 200B) is disposed correspondingly to one electrode 120A (or 120B). In this embodiment, each micro-device 200A (or 200B) may be located directly above the corresponding electrode 120A (or 120B), but the present invention is not limited herein, and in other embodiments, the micro-device 200A (or 200B) may also be slightly offset from the corresponding electrode 120A (or 120B). The plurality of micro-devices 200A and 200B include a first micro-device 200A and a second micro-device 200B. The first micro-device 200A indicates a micro-device not to be picked up, and the second micro-device 200B indicates a micro-device to be picked up.

Figure 3:
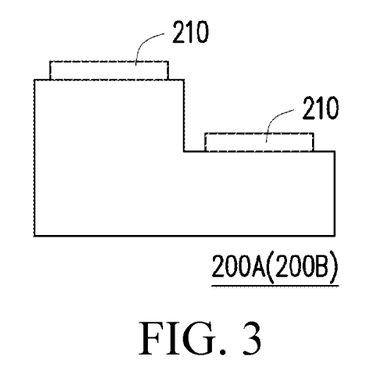
FIG. 3 is an amplified schematic diagram of a micro-device according to an embodiment of the present invention.

FIG. 3 is an amplified schematic diagram of a micro-device according to an embodiment of the present invention. Referring to FIG. 3, the micro-device 200A (or 200B) is provided with electrodes 210. In this embodiment, the micro-device 200A (or 200B) is, for example, a micro-light emitting diode (micro-LED). The two electrodes 210 of the micro-device 200A (or 200B) are located on the exterior of the micro-device in FIG. 3. That is, the micro-device 200A (or 200B) in this embodiment is a horizontal type light-emitting diode. However, the present invention is not limited herein, and in other embodiments, the micro-devices 200A and 200B may also be other suitable types of light-emitting diodes. In addition, the micro-device of the present invention is also not limited to the micro-light emitting diode, and in other embodiments, the micro-device may also be another type of an electronic element, for example, a microchip.

Referring to FIG. 2A, subsequently, a transfer stamp 300 is provided. The transfer stamp 300 is provided with a transfer plane 300a. The whole transfer plane 300a is substantially located in the same plane. In this embodiment, the transfer stamp 300 may be a poly dimethyl siloxane stamp (PDMS stamp). However, the present invention is not limited herein, and in other embodiments, the transfer stamp 300 may also be made of other elastomers with a low Young's modulus.

Figure 2B:
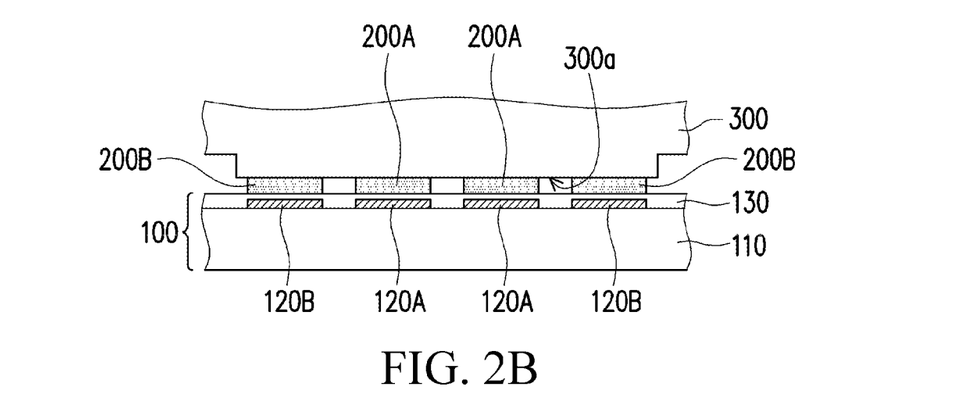
Figure 4:
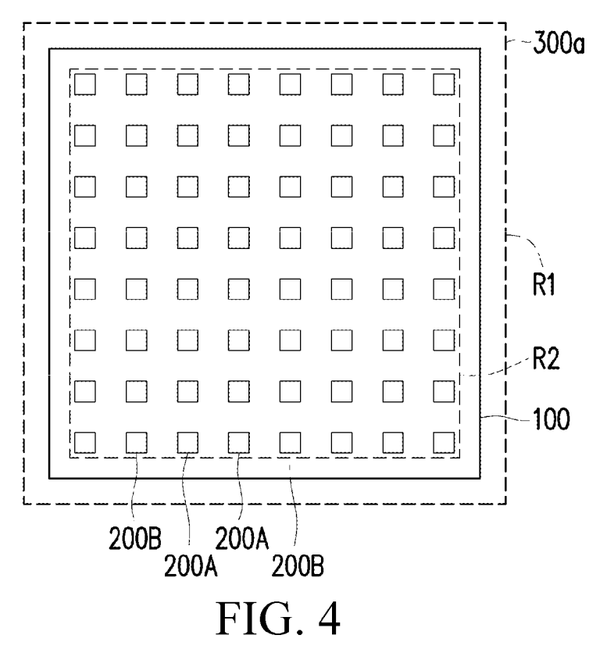
FIG. 4 is a schematic top view of a carrying unit 100, all micro-devices 200A and 200B configured on the carrying unit 100, and a transfer plane 300a of a transfer stamp 300 in FIG. 2B.

Referring to FIG. 2B, subsequently, a transfer plane 300a of transfer stamp 300 is contacts the first micro-device 200A and the second micro-device 200B. FIG. 4 is a schematic top view of the carrying unit 100, all the micro-devices 200A and 200B configured on the carrying unit 100, and the transfer plane 300a of the transfer stamp 300 in FIG. 2B. Referring to FIG. 2B and FIG. 4, when the transfer plane 300a is in contact with the first micro-device 200A and the second micro-device 200B, an area R1 of the transfer plane 300 exceeds a distribution range R2 of the plurality of micro-devices 200A and 200B. That is, the transfer plane 300a is a single and continuous plane, and the transfer plane 300a can contact all of the micro-devices 200A and 200B on the carrying unit 100 when the transfer plane 300a contacts the first micro-device 200A and the second micro-device 200B.

Figure 2C:
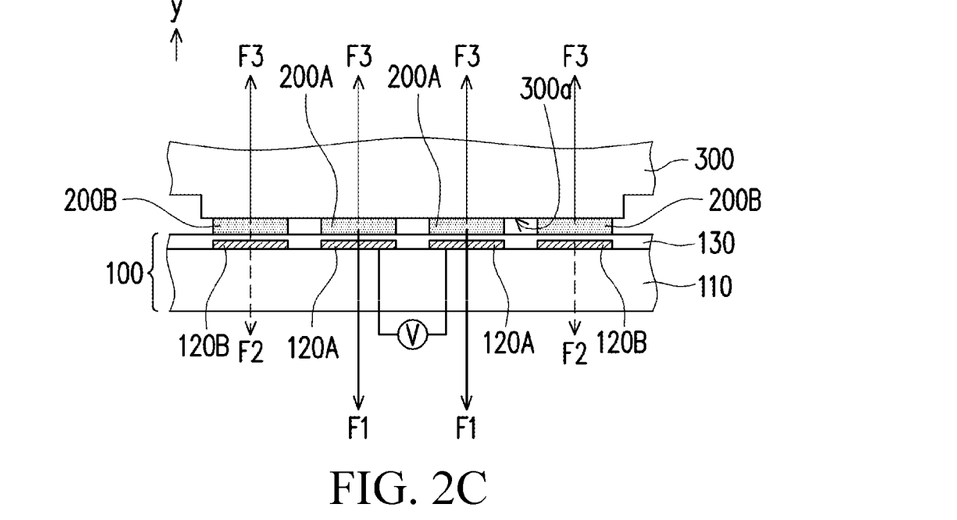

Referring to FIG. 2C, subsequently, a voltage V is applied to the electrode 120A corresponding to the first micro-device 200A, so that an electrostatic force F1 generated on the first micro-device 200A by the carrying unit 100 is larger than an electrostatic force F2 generated on the second micro-device 200B by the carrying unit 100. In this embodiment, optionally, no voltage is applied to the electrode 120B corresponding to the second micro-device 200B when the voltage V is applied to the electrode 120A corresponding to the first micro-device 200A.

In this case, a part of the dielectric layer 130 directly above the electrode 120A may be polarized, and the other part of the dielectric layer 130 directly above the electrode 120B is not readily polarized. When the part of the dielectric layer 130 above the electrode 120A is polarized, a polarization charge may be generated on a surface of the part of the dielectric layer 130, and the polarization charge may generate the electrostatic force F1 on the electrodes 210 (shown in FIG. 3) of the first micro-device 200A. At the same time a surface of the part of the dielectric layer 130 directly above the electrode 120B does not readily have a polarization charge, and therefore the surface does not readily attract the electrodes 210 of the second micro-device 200B. Further, in this embodiment, the electrostatic force F2 generated on the second micro-device 200B by the part of the dielectric layer 130 directly above the electrode 120B may be close to 0.

Although the present invention is described by using F2 that is close to 0 as an example, the present invention does not define that the electrostatic force F2 generated on the second micro-device 200B by the carrying unit 100 needs to be zero. That is, the present invention does not define that a voltage cannot be applied to the electrode 120B corresponding to the second micro-device 200B, and in other embodiments, optionally, voltages may also be applied to the electrodes 120A and 120B simultaneously, insofar as the voltage applied to the electrode 120B needs to be less than the voltage applied to the electrode 120A, so that the electrostatic force F2 generated on the second micro-device 200B by the carrying unit 100 is less than the electrostatic force F1 generated on the first micro-device 200A by the carrying unit 100.

Figure 2D:
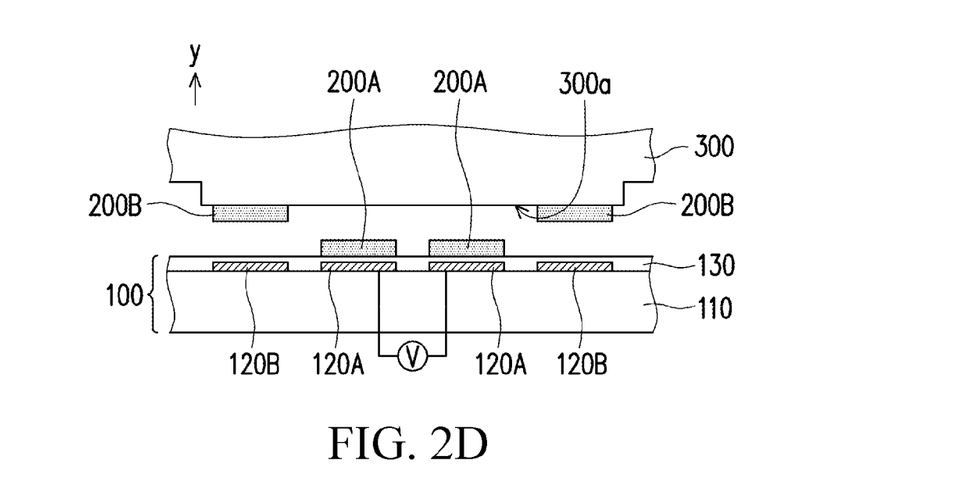

Referring to FIG. 2C and FIG. 2D, subsequently, the transfer stamp 300 is moved when the transfer stamp 300 is in contact with the first micro-device 200A and the second micro-device 200B and F1>F2, so that the second micro-device 200B is picked up by the transfer stamp 300 and the first micro-device 200A remains on the carrying unit 100. Specifically, as shown in FIG. 2C, after the transfer plane 300a of the transfer stamp 300 contacts the first micro-device 200A and the second micro-device 200B, the transfer stamp 300 starts to move in a direction y away from the carrying unit 100. At this time, the transfer plane 300a of the transfer stamp 300 may apply a same force F3 on the first micro-device 200A and the second micro-device 200B. The transfer plane 300a of the transfer stamp 300 is configured to selectively apply an electrostatic force across the entire surface of the plane. The direction of the force F3 is opposite to the direction of the electrostatic forces F1 and F2.

When F2<F3, the transfer stamp 300 may pick up the second micro-device 200B; additionally, when F3<F1, the transfer stamp 300 cannot pick up the first micro-device 200A, so that the first micro-device 200A remains on the carrying unit 100. In this embodiment, by setting a suitable range for a moving speed of the transfer stamp 300, the force F3 applied on the micro-devices 200A and 200B by the transfer stamp 300 may be set between the electrostatic force F2 generated on the second micro-device 200B by the carrying unit 100 and the electrostatic force F1 generated on the first micro-device 200A by the carrying unit 100, so that the transfer stamp 300 picks up the second micro-device 200B, does not pick up the first micro-device 200A, and F2<F3<F1.

It should be noted that, as shown in FIG. 2C and FIG. 2D, by using the technical means of applying a voltage V to the electrode 120A corresponding to the first micro-device 200A, so that an electrostatic force F1 generated on the first micro-device 200A by the carrying unit 100 is larger than an electrostatic force F2 generated by the carrying unit 100, the transfer plane 300a of the transfer stamp 300 can contact all micro-devices 200A and 200B simultaneously, so that the needed micro-device 200B is picked up. That is, unlike the existing prior art, a needed micro-device can be picked up without aligning a plurality of lug protrusions of a transfer stamp with a plurality of micro-devices to be picked up, that is, in a manner that one lug protrusion needs to correspond to one micro-device. Therefore, the method of transferring a micro-device in this embodiment can reduce at least one aligning step, so that the speed of transferring a micro-device is increased.

Figure 2E:
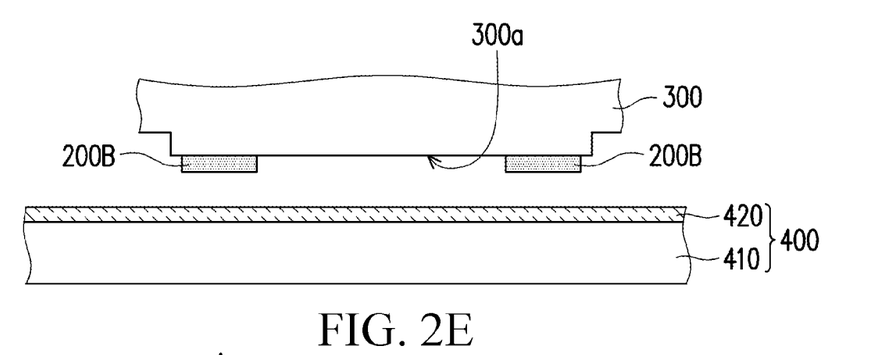
Figure 2F:
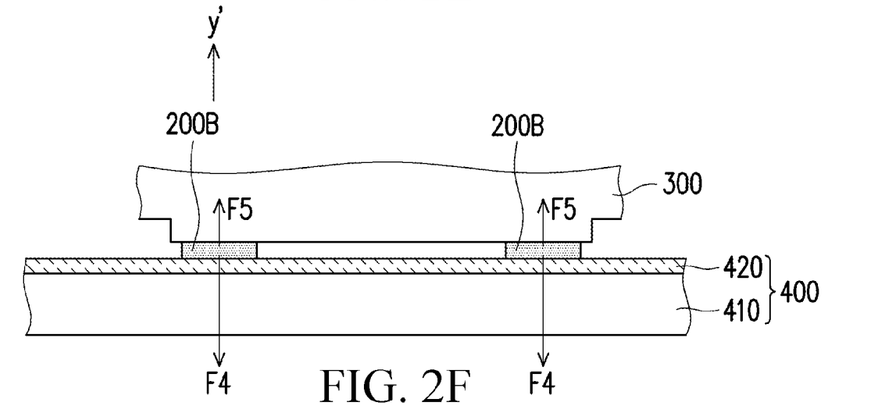
Figure 2G:
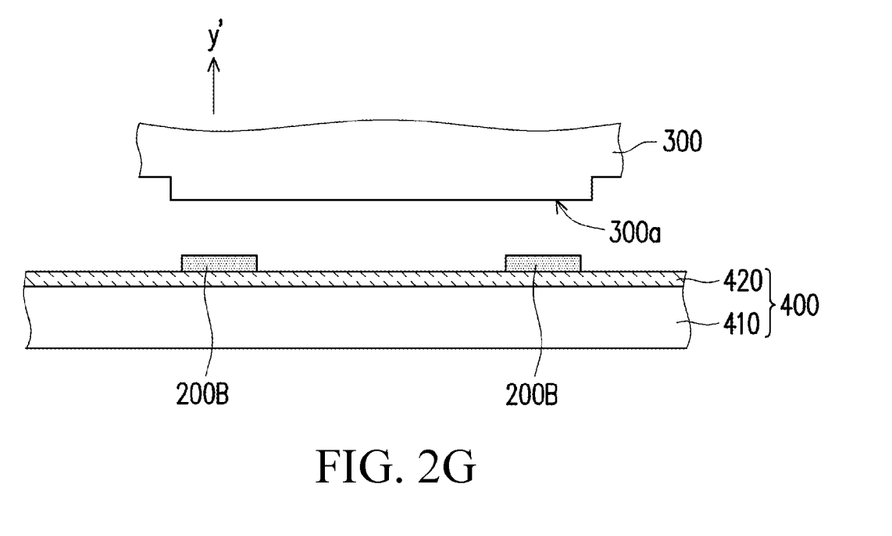

Referring to FIG. 2E to FIG. 2G, after the transfer stamp 300 picks up the needed second micro-device 200B, the second micro-device 200B may be then transferred to a receiving unit 400 by using the transfer stamp 300. A receiving unit 400 includes a receiving substrate 410 and a receiving layer 420 configured on the receiving substrate 410. Specifically, as shown in FIG. 2E and FIG. 2F, in this embodiment, the second micro-device 200B is first carried to a receiving layer 420 of the receiving unit 400 by the transfer stamp 300, so as to engage the second micro-device 200B with the receiving layer 420 of the receiving unit 400. A joint force between the second micro-device 200B and the receiving layer 420 is F4.

Referring to FIG. 2F and FIG. 2G, subsequently, after the second micro-device 200B is engaged with the receiving layer 420 of the receiving unit 400, the transfer stamp 300 is moved in a direction y' away from the receiving unit 400. At this time, the transfer stamp 300 may apply a force F5 on the second micro-device 200B, wherein F4>F5, and the direction of the joint force F4 is opposite to the direction of the force F5. Because F4>F5, the transfer stamp 300 separates from the second micro-device 200B and the second micro-device 200B remains on the receiving unit 400.

In this embodiment, the receiving substrate 410 of the receiving unit 400 is, for example, a glass substrate, and the receiving layer 420 of the receiving unit 400 is, for example, a photoresist layer. As shown in FIG. 2F, the second micro-device 200B may be first in contact with the photoresist layer (that is, the receiving layer 420) before the photoresist layer (that is, the receiving layer 420) is cured. Then, the photoresist layer (that is, the receiving layer 420) is cured in a condition in which the second micro-device 200B is in contact with the photoresist layer (that is, the receiving layer 420), so as to engage the second micro-device 200B with the receiving unit 400.

As shown in FIG. 2F and FIG. 2G, subsequently, after the photoresist layer (that is, the receiving layer 420) is cured, the transfer stamp 300 is moved in a direction y' away from the receiving unit 400, so as to remain the second micro-device 200B on the receiving unit 400. It should be noted that although the present invention is described by using the above example in which a glass substrate and a photoresist layer are respectively used as the receiving substrate 410 and the receiving layer 420, the present invention does not define that the receiving substrate 410 needs to be a glass substrate and/or the receiving layer 420 needs to be a photoresist layer. The receiving substrate 410 and/or the receiving layer 420 may be made of other suitable materials according to needs of an actual product and manufacturing process thereof. The present invention is described below with examples in combination with FIG. 5A to FIG. 5G.

FIG. 5A to FIG. 5G are schematic sectional views of a method of transferring a micro-device according to another embodiment of the present invention. The method of transferring a micro-device in FIG. 5A to FIG. 5G is similar to the method of transferring a micro-device in FIG. 2A to FIG. 2G. Therefore, the same or corresponding elements are marked by the same or corresponding labels. Major differences between the method of transferring a micro-device in FIG. 5A to FIG. 5G and the method of transferring a micro-device in FIG. 2A to FIG. 2G lie in: the micro-devices 200A, 200B, 200A', and 200B' transferred in the two methods are not exactly the same; besides, the methods of engaging the micro-devices 200A, 200B, 200A', and 200B' with the corresponding receiving layers 420 and 420 are not exactly the same. Description is provided below with regard to the differences, and the same features can be referred to in the foregoing description according to the labels in FIG. 5A to FIG. 5G, and are not described herein again.

Figure 5A:
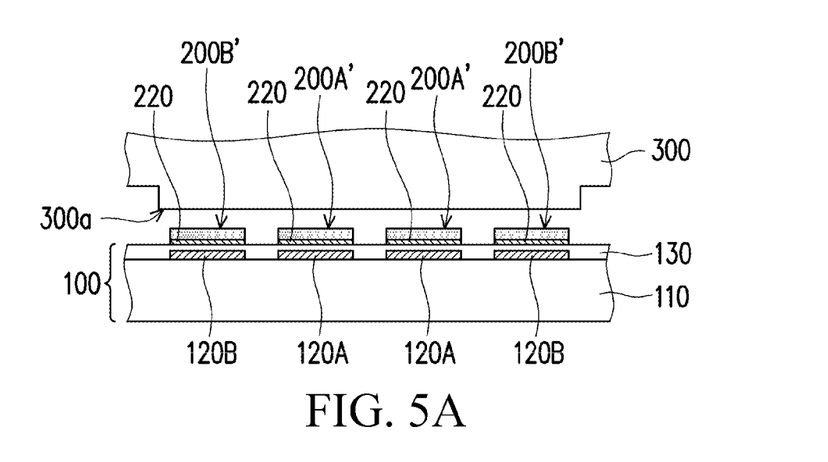
FIG. 5A to FIG. 5G are schematic sectional views of a method of transferring a micro-device according to another embodiment of the present invention.

Referring to FIG. 5A, first a carrying unit 100 is provided. The carrying unit 100 includes a carrying substrate 110, a plurality of electrodes 120A and 120B configured on the carrying substrate 110, and a dielectric layer 130 covering the plurality of electrodes 120A and 120B. Subsequently, a plurality of micro-devices 200A' and 200B' is provided, and the plurality of micro-devices 200A' and 200B' are configured on the dielectric layer 130 of the carrying unit 110. Each micro-device 200A' (or 200B') is disposed correspondingly to one electrode 120A (or 120B). Each micro-device 200A' (or 200B') is provided with a metal layer 220. The plurality of micro-devices 200A' and 200B' includes a first micro-device 200A' and a second micro-device 200B'. The first micro-device 200A' indicates a micro-device not to be picked up, and the second micro-device 200B' indicates a micro-device to be picked up.

Figure 5B:
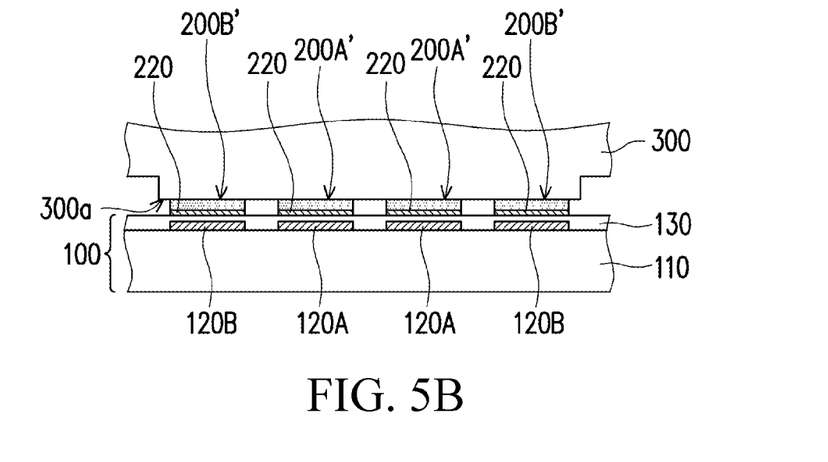
Figure 5C:
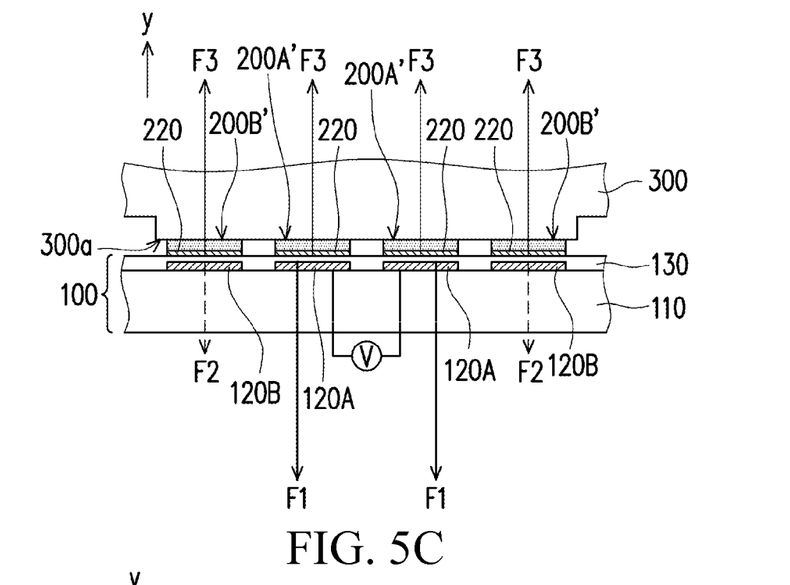
Figure 6:
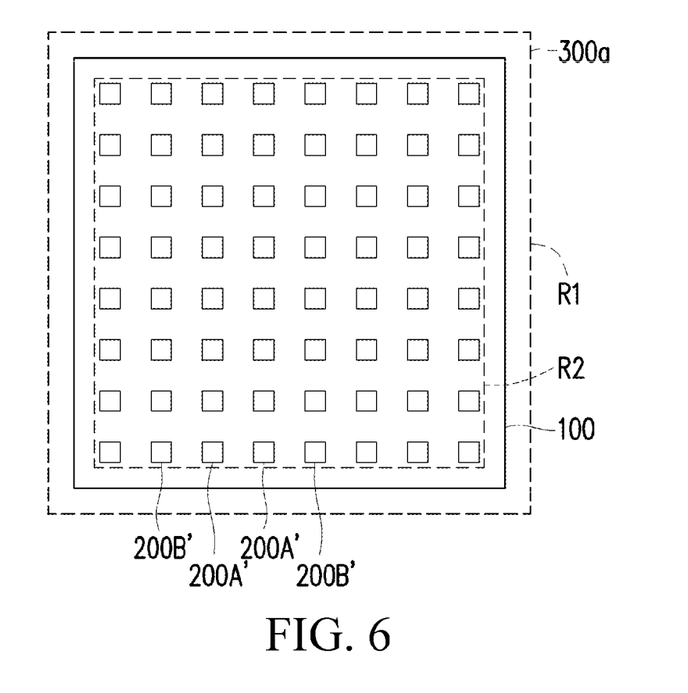
FIG. 6 is a schematic top view of a carrying unit 100, all micro-devices 200A' and 200B' configured on the carrying unit 100, and a transfer plane 300a of a transfer stamp 300 in FIG. 5B.

FIG. 6 is a schematic top view of a carrying unit 100, all micro-devices 200A' and 200B' configured on the carrying unit 100, and a transfer plane 300a of a transfer stamp 300 in FIG. 5B. Referring to FIG. 5B and FIG. 6, subsequently, the transfer stamp 300 having the transfer plane 300a is provided. Then, the transfer plane 300a of a transfer stamp 300 is in contact with the first micro-device 200A' and the second micro-device 200B', wherein an area R1 of the transfer plane 300a exceeds a distribution range R2 of the plurality of micro-devices 200A' and 200B' when the transfer stamp 300 is in contact with the first micro-device 200A' and the second micro-device 200B'. Referring to FIG. 5C, subsequently, a voltage V is applied to the electrode 120A corresponding to the first micro-device 200A', so that an electrostatic force F1 generated on the first micro-device 200A' by the carrying unit 100 is larger than an electrostatic force F2 generated on the second micro-device 200B' by the carrying unit 100.

Figure 5D:
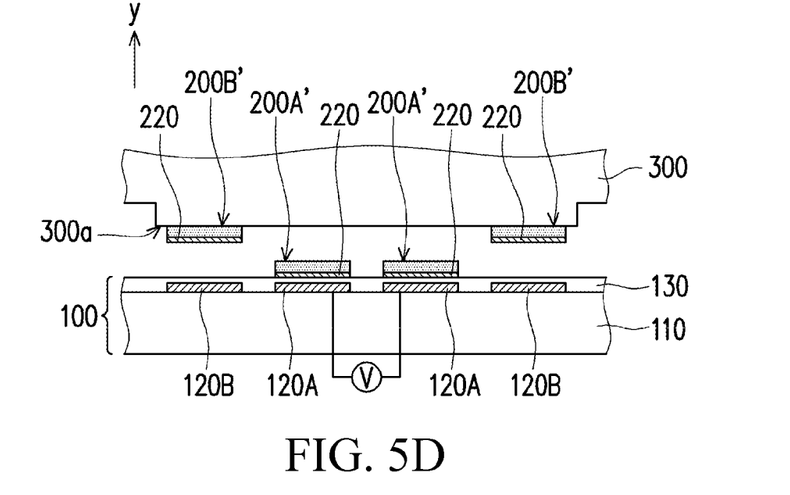

Referring to FIG. 5D, subsequently, the transfer stamp 300 is moved in a condition in which the transfer stamp 300 is in contact with the first micro-device 200A' and the second micro-device 200B' and F1>F2, so that the second micro-device 200B' is picked up by the transfer stamp 300 and the first micro-device 200A' remains on the carrying unit 100.

Figure 5E:
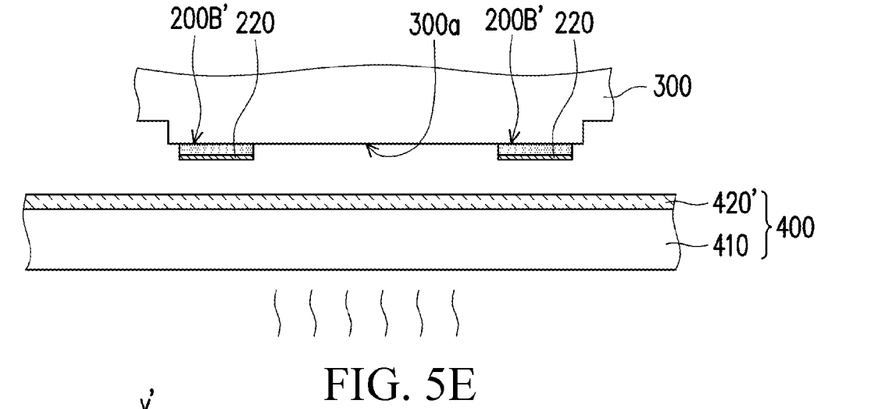
Figure 5F:
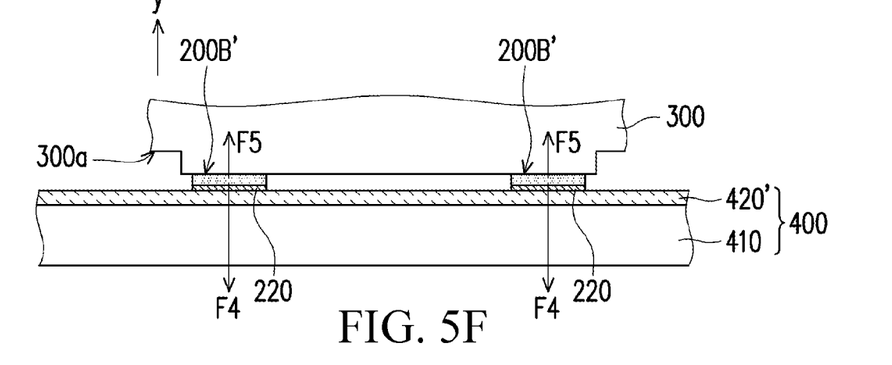
Figure 5G:
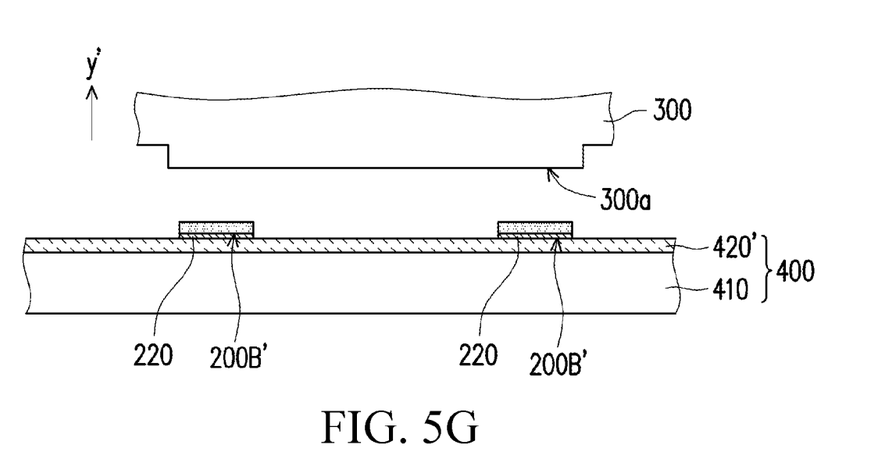

Referring to FIG. 5E to FIG. 5G, subsequently, the second micro-device 200B' may be transferred to a receiving unit 400 by using the transfer stamp 300. The receiving unit 400 includes a receiving substrate 410 and a receiving layer 420' configured on the receiving substrate 410. Unlike the embodiment in FIG. 2A to FIG. 2G, in the embodiment of FIG. 5A to FIG. 5G, the receiving layer 420' is a metal layer. Specifically, as shown in FIG. 5E, in this embodiment, the receiving unit 400 may be heated first, so that the receiving layer 420' of the receiving unit 400 is in a liquid state.

Referring to FIG. 5F, subsequently, the metal layer 220 of the second micro-device 200B' is then contacts the liquid receiving layer 420', after which the temperature of the receiving layer 420' is reduced in a condition in which the metal layer 220 of the second micro-device 200B' is in contact with the liquid receiving layer 420', so that the receiving layer 420' and the metal layer 220 of the second micro-device 200B' form an alloy, so as to secure the second micro-device 200B' on the receiving unit 400. As shown in FIG. 5G, subsequently, the transfer stamp 300 is moved in a direction y' away from the receiving unit 400, so as to remain the second micro-device 200B' on the receiving unit 400, so that the action of transferring a micro-device is completed.

In view of the above, in the method of transferring a micro-device in an embodiment of the present invention, by applying a voltage to an electrode corresponding to a micro-device not to be picked up, an electrostatic force generated by a carrying unit on a micro-device not to be picked up can be larger than an electrostatic force generated, by the carrying unit on a micro-device to be picked up. In this case, a transfer plane of a transfer stamp may be moved in a direction away from the carrying unit after being simultaneously in contact with the micro-device to be picked up and the micro-device not to be picked up, so as to pick up a needed micro-device and leave a micro-device that is not needed. That is, unlike the existing prior art, a correct micro-device can be picked up without aligning a plurality of lug protrusions of a transfer stamp with a plurality of micro-devices to be picked up. Therefore, the method of transferring a micro-device according to an embodiment of the present invention can reduce at least one aligning step, so that the speed of transferring a micro-device is increased.

It will be apparent to a person skilled in the art that various modifications and variations can be made by a person skilled in the art without departing from the spirit and scope of the present invention, though the present invention is disclosed by using embodiments above. Therefore, the protection scope of the present invention should be subject to the scope defined by the claims of the application below.

What is claimed is:

1. A method of transferring a micro-device, comprising:
providing a carrying unit, wherein said carrying unit comprises a carrying substrate;
providing a plurality of electrodes configured on said carrying substrate, wherein said plurality of electrodes comprises a first electrode and a second electrode;
providing a dielectric layer covering said plurality of electrodes;
providing a plurality of micro-devices, wherein said plurality of micro-devices comprises a first micro-device and a second micro-device, said plurality of micro-devices are configured on said dielectric layer, said first micro-device is disposed corresponding to said first electrode, and said second micro-device is disposed corresponding to said second electrode;
applying a voltage to said first electrode, wherein an electrostatic force F1 generated on said first micro-device by said carrying unit is larger than an electrostatic force F2 generated on said second micro-device by said carrying unit;
providing a transfer stamp, comprising a transfer plane;
contacting said transfer plane with both said first micro-device and said second micro-device;
moving said transfer stamp away from said plurality of micro-devices, and said second micro-device is picked up by said transfer stamp, said first micro-device remains on said carrying unit, and F1>F2; and
transferring said second micro-device to a receiving unit by said transfer stamp.

2. The method of transferring the micro-device according to claim 1, wherein the step of moving said transfer stamp, further comprises:
moving said transfer stamp away from said carrying unit, wherein said transfer stamp applies a force F3 on said first micro-device and said second micro-device, wherein F2<F3<F1, both the electrostatic force F1 and the electrostatic force F2 have a first direction, said force F3 has a second direction, and said first direction is opposite to said second direction.

3. The method of transferring the micro-device according to claim 1, wherein the receiving unit comprises a receiving substrate and a receiving layer configured on the receiving substrate, and the step of transferring the second micro-device to a receiving unit by the transfer stamp comprises:
carrying said second micro-device to said receiving layer by said transfer stamp, for engaging said second micro-device with said receiving layer; and
moving said transfer stamp away from said receiving unit after said second micro-device is engaged with said receiving layer, so that said transfer stamp is separated from said second micro-device.

4. The method of transferring the micro-device according to claim 3, wherein a joint force F4 is between said second micro-device and said receiving layer, said transfer stamp applies a force F5 on said second micro-device when said transfer stamp is moved away from said receiving unit, wherein F4>F5.

5. The method of transferring the micro-device according to claim 3, wherein said receiving layer is a photoresist layer, and the step of engaging said second micro-device with said receiving layer comprises:
contacting said second micro-device with said photoresist layer before said photoresist layer is cured; and
curing said photoresist layer when said second micro-device is in contact with said photoresist layer.

6. The method of transferring the micro-device according to claim 3, wherein said receiving layer is a first metal layer, said second micro-device is provided with a second metal layer, and the step of engaging said second micro-device with said receiving layer comprises:
heating said receiving unit to transform said first metal layer on the receiving unit is into a liquid state;
contacting said second metal layer and said first metal layer; and
reducing a temperature of said first metal layer for said first metal layer and said second metal layer form an alloy.

7. The method of transferring the micro-device according to claim 1, wherein said transfer stamp is made of a first material, wherein said first material comprises polydimethylsiloxane.

8. The method of transferring the micro-device according to claim 1, wherein said plurality of micro-devices are a plurality of micro-light emitting diodes.

* * * * *